(12) United States Patent
Hamari et al.

(10) Patent No.: US 9,974,214 B2
(45) Date of Patent: May 15, 2018

(54) COOLED POWER CONVERSION ASSEMBLY

(71) Applicant: ABB Technology AG, Zürich (CH)

(72) Inventors: Juha Hamari, Nurmijärvi (FI); Jani Kangas, Helsinki (FI); Mikko Myller, Espoo (FI); Dan Millner, Espoo (FI)

(73) Assignee: ABB Schweiz AG, Baden (CH)

( * ) Notice: Subject to any disclaimer, the term of this patent is extended or adjusted under 35 U.S.C. 154(b) by 0 days. days.

(21) Appl. No.: 15/082,566

(22) Filed: Mar. 28, 2016

(65) Prior Publication Data

US 2016/0302330 A1    Oct. 13, 2016

(30) Foreign Application Priority Data

Apr. 9, 2015  (EP) .................................... 15162914

(51) Int. Cl.
*H05K 7/20* (2006.01)
*H02M 7/00* (2006.01)

(52) U.S. Cl.
CPC ........ *H05K 7/20909* (2013.01); *H02M 7/003* (2013.01); *H05K 7/206* (2013.01); *H05K 7/209* (2013.01); *H05K 7/20754* (2013.01); *H05K 7/20854* (2013.01); *H05K 7/20863* (2013.01)

(58) Field of Classification Search
CPC ....... H02M 7/003; H05K 7/202; H05K 7/206; H05K 7/20145; H05K 7/20154; H05K 7/20163; H05K 7/20918
USPC ............ 361/696–700, 679.46, 679.49, 679.5
See application file for complete search history.

(56) References Cited

U.S. PATENT DOCUMENTS

| 3,829,740 | A | * | 8/1974 | Beasley ................. F28D 15/02 165/104.33 |
| 5,765,743 | A | * | 6/1998 | Sakiura ................. F24F 11/053 165/80.3 |
| 2012/0014063 | A1 | * | 1/2012 | Weiss ................. H05K 7/20163 361/697 |
| 2013/0343110 | A1 | * | 12/2013 | Liu .................... H05K 7/20909 363/141 |

FOREIGN PATENT DOCUMENTS

| DE | 9111434 U1 | 12/1991 |
| GB | 2329012 A | 3/1999 |

(Continued)

OTHER PUBLICATIONS

European Search Report 15162914.4, ABB Technology AG, Sep. 10. 2015.
Japanese Office Action, JP2006-077220, Oct. 29, 2011, 9 pages.

*Primary Examiner* — Mukund G Patel

(57) ABSTRACT

A cooled power conversion assembly comprising a first chamber, a second chamber at least partially separated from the first chamber, at least one first type device located in the first chamber, at least one second type device located in the second chamber, and cooling means comprising a first cooling element and a second cooling element. The first cooling element is adapted to transfer heat out of the first chamber, and the second cooling element is adapted to transfer heat out of the second chamber. The first cooling element is in direct contact with the at least one first type device, and the second cooling element is in a heat transfer connection with the at least one second type device through a gaseous cooling medium.

9 Claims, 2 Drawing Sheets

(56) References Cited

FOREIGN PATENT DOCUMENTS

| | | |
|---|---|---|
| JP | 52127771 A | 10/1977 |
| JP | H02118379 A | 5/1990 |
| JP | H09246767 A | 9/1997 |
| JP | 2011047616 A | 3/2011 |
| JP | 2013193632 A | 9/2013 |
| JP | 2015021725 A | 2/2015 |
| WO | 2014068651 A1 | 5/2014 |

* cited by examiner

COOLED POWER CONVERSION ASSEMBLY

FIELD OF THE INVENTION

The present invention relates to a cooled power conversion assembly.

A known power conversion assembly comprises heat generating devices in a housing, and at least one heat exchanger adapted to transfer heat out of the housing, the at least one heat exchanger utilizing circulation of liquid coolant.

One of the problems associated with the above power conversion assembly is its complexity.

BRIEF DESCRIPTION OF THE INVENTION

An object of the present invention is to provide a cooled power conversion assembly having simple cooling means. The objects of the invention are achieved by a cooled power conversion assembly which is characterized by what is stated in the independent claim. The preferred embodiments of the invention are disclosed in the dependent claims.

The invention is based on the idea of using base-to-air cooling elements for cooling high heat density devices of a cooled power conversion assembly, and using air-to-air cooling elements for cooling low heat density devices of the cooled power conversion assembly.

The cooled power conversion assembly of the invention is simple and inexpensive.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
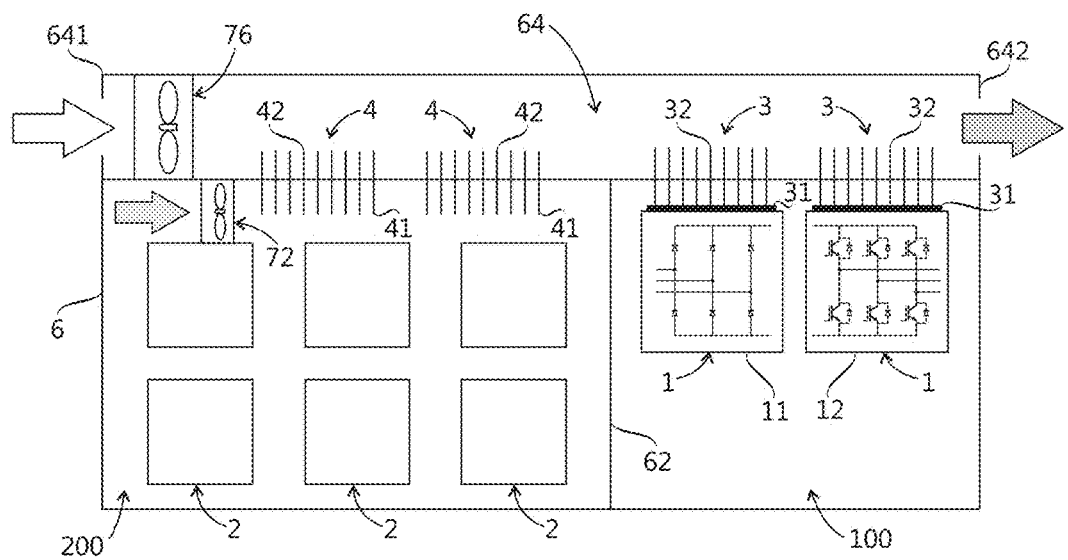
FIG. 1 shows a principle structure of a cooled power conversion assembly according to an embodiment of the invention.

FIG. 1 shows a principle structure of a cooled power conversion assembly comprising a housing 6, a first chamber 100, a second chamber 200, two first type devices 1, six second type devices 2, cooling means for cooling the first chamber and the second chamber, a cooling channel 64, cooling channel fan means 76 and second chamber fan means 72. The first chamber 100 and the second chamber 200 are located inside the housing 6. The first type devices 1 are located in the first chamber 100, and the second type devices 2 are located in the second chamber 200.

The cooling means comprises two first cooling elements 3 and two second cooling elements 4. Each first cooling element 3 is adapted to transfer heat out of the first chamber 100. Each first cooling element 3 comprises a first portion 31 located in the first chamber 100 and a second portion 32 located outside the first chamber 100. The first portion 31 of each first cooling element 3 is in direct contact with a corresponding first type device 1. Heat transfer between the first type device 1 and corresponding first cooling element 3 is adapted to take place through heat conduction.

Each second cooling element 4 is adapted to transfer heat out of the second chamber 200. Each second cooling element 4 comprises a first portion 41 located in the second chamber 200 and a second portion 42 located outside the second chamber 200. Each second cooling element 4 is in a heat transfer connection with a corresponding second type device 2 exclusively through a gaseous cooling medium. Neither one of the second cooling elements 4 is in direct contact with a second type device 2. Further, neither one of the second cooling elements 4 is in direct contact with any device that generates heat. Heat transfer between the second type device 2 and corresponding second cooling element 4 is adapted to take place through heat convection.

In an alternative embodiment at least one of the second cooling elements comprises a plurality of individual cooling elements stacked together. Each of the plurality of individual cooling elements is adapted to be cooled with substantially the same cooling medium flow.

The cooling channel 64 extends through the housing 6. The cooling channel 64 has a first end 641 and a second end 642. The cooling channel fan means 76 is adapted for providing a cooling channel cooling medium flow between the first end 641 of the cooling channel and the second end 642 of the cooling channel. The cooling channel cooling medium flow is directed from the first end 641 of the cooling channel towards the second end 642 of the cooling channel.

The gaseous cooling medium inside the second chamber 200 is air. There is also air inside the first chamber 100 and inside the cooling channel 64. The cooling channel fan means 76 sucks air from outside of the housing 6 to the first end 641 of the cooling channel, and blows air to the outside of the housing 6 from the second end 642 of the cooling channel. Since there is air in the cooling channel 64, it can be said that each first cooling element 3 is adapted to function as a base-to-air cooling element, and each second cooling element 4 is adapted to function exclusively as an air-to-air cooling element.

The second chamber 200 is separated from the first chamber 100 by a separating wall 62. There is substantially no cooling medium flow between the first chamber 100 and the second chamber 200. Each of the first chamber 100 and the second chamber 200 is also separated from the cooling channel 64 and from the outside of the housing 6. The first chamber 100 and the second chamber 200 are ingress protected chambers. There is substantially no cooling medium flow between the first chamber 100 and the cooling channel 64, or between the first chamber 100 and the outside of the housing 6. Also, there is substantially no cooling medium flow between the second chamber 200 and the cooling channel 64, or between the second chamber 200 and the outside of the housing 6. The cooling channel 64 is not an ingress protected channel. In an alternative embodiment a second chamber is only partially separated from the first chamber.

The second portions 32 of the first cooling elements 3 and the second portions 42 of the second cooling elements 4 are located in the cooling channel 64. The second portions 42 of the second cooling elements 4 are located upstream of the second portions 32 of the first cooling elements 3, which means that the second portions 42 of the second cooling elements 4 are located nearer the first end 641 of the cooling channel than the second portions 32 of the first cooling elements 3.

The second chamber fan means 72 is adapted for providing a second chamber cooling medium flow inside the second chamber 200. The second chamber cooling medium flow is adapted to enhance heat transfer from the second type devices 2 to the first portions 41 of the second cooling elements 4. Since the second chamber 200 is separated from the first chamber 100, the second chamber fan means 72 is not adapted for providing a cooling medium flow in the first chamber 100.

The cooled power conversion assembly of FIG. 1 is a cooled frequency converter. The first type device 1 on the left comprises a diode module 11 of a rectifier unit. The diode module 11 comprises diodes of the rectifier unit, the diodes being adapted to rectify input current of the rectifier unit. The diode module 11 is in direct heat transfer contact with the first portion 31 of the first cooling element 3 on the left. The first type device 1 on the right comprises a switch module 12 of an inverter unit. The switch module 12 comprises controllable switches of the inverter unit, the controllable switches being adapted to invert input current of the inverter unit. The controllable switches have high heat density and therefore they require efficient cooling. In an embodiment the controllable switches comprise known semiconductor switches such as insulated-gate bipolar transistors, or IGBTs.

In an alternative embodiment a cooled power conversion assembly is a DC-to-DC converter, an inverter, or some other assembly adapted to convert electric energy from one form to another. A DC-to-DC converter, or direct-current converter, comprises controllable switches having high heat density. In general, heat density of the at least one first type device is higher than heat density of the at least one second type device.

The second type devices 2 comprise protection means and connection means. The protection means is adapted for protecting the at least one first type device 1, and comprises fuses for that purpose. The connection means is adapted for connecting the first type devices 1 to a supply and a load. The connection means comprises a contactor for connecting the diode module 11 to a power supply, and another contactor for connecting the switch module 12 to a load such as an electric motor. The heat density of the protection means and the connection means is low.

In an embodiment the at least one first type device comprises a switch module of an inverter unit adapted to feed power from photovoltaic cell means to an electrical network. In this embodiment the connection means is adapted for connecting the inverter unit to the photovoltaic cell means and to the electrical network. The photovoltaic cell means acts as a supply for the inverter unit, and the electrical network acts as a load for the inverter unit. The connection means comprises at least one of the following: a contactor, a switch, a connector and a breaker.

Each of the first cooling elements 3 and each of the second cooling elements 4 comprises a cooling fin whose second portion is located in the cooling channel 64. The cooling fins are adapted to transfer heat into the cooling channel cooling medium flow. In an alternative embodiment at least one of the first cooling elements and second cooling elements comprises a thermosiphon such as a compact thermosiphon, or cothex. It is also possible to use a heat pipe of another type.

Figure 2:
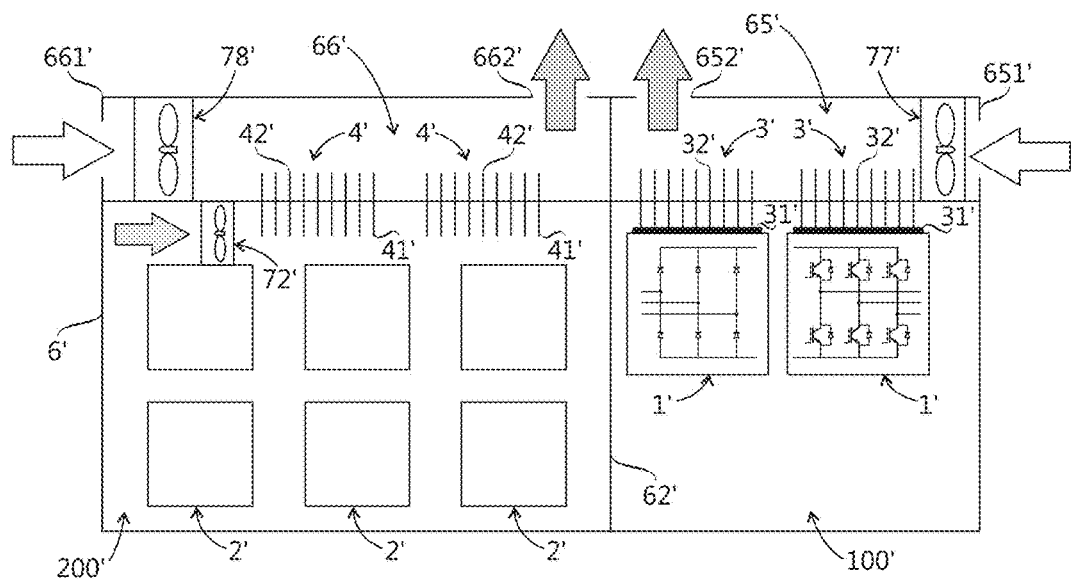
FIG. 2 shows a principle structure of a cooled power conversion assembly according to another embodiment of the invention.

In the embodiment of FIG. 1 the cooling channel 64 is common for the first chamber 100 and the second chamber 200. FIG. 2 shows a cooled power conversion assembly according to another embodiment of the invention. The cooled power conversion assembly of FIG. 2 comprises two cooling channels, a first cooling channel 65' for the first chamber 100', and a second cooling channel 66' for the second chamber 200'. The first cooling channel 65' is separated from the second cooling channel 66'. Except for the difference relating to the cooling channel, the cooled power conversion assembly of FIG. 2 is similar to the cooled power conversion assembly of FIG. 1.

The first cooling channel 65' has a first end 651' and a second end 652'. There is a first cooling channel fan means 77' adapted for providing a cooling medium flow between the first end 651' and the second end 652'. The cooling medium flow inside the first cooling channel 65' is directed from the first end 651' towards the second end 652'.

The second cooling channel 66' has a first end 661' and a second end 662'. There is a second cooling channel fan means 78' adapted for providing a cooling medium flow between the first end 661' and the second end 662'. The cooling medium flow inside the second cooling channel 66' is directed from the first end 661' towards the second end 662'.

Figure 3:
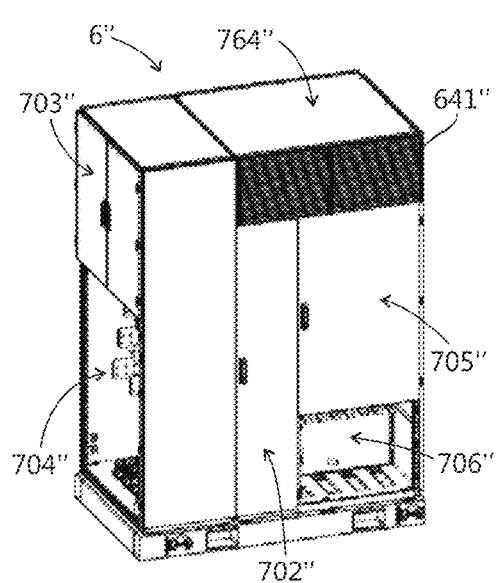
FIG. 3 shows a power converter cabinet comprising a cooled power conversion assembly according to yet another embodiment of the invention.

FIG. 3 shows a power converter cabinet comprising a cooled power conversion assembly according to yet another embodiment of the invention. In FIG. 3 the power converter cabinet is depicted from the direction of a first end 641" of a cooling channel. FIG. 3 shows that the housing 6" comprises a second type device section 702", a control component section 703", an AC cabling section 704", a DC component section 705", a DC cabling section 706", and a cooling channel section 764". The second type device section 702" and the DC component section 705" comprise the second chamber 200". The cooling channel section 764" comprises the cooling channel.

Figure 4:
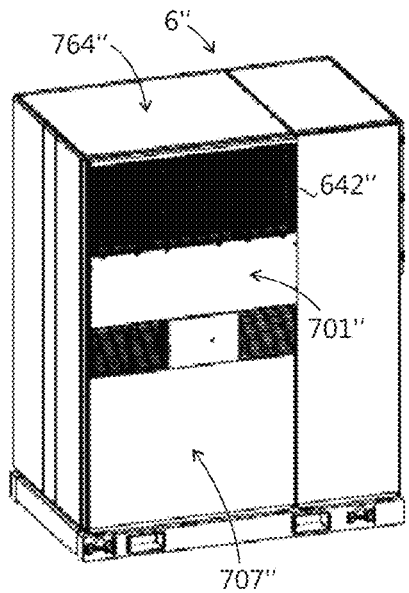
FIG. 4 shows the power converter cabinet of FIG. 3 from a different direction.

In FIG. 4 the power converter cabinet of FIG. 3 is depicted from the direction of a second end 642" of the cooling channel. FIG. 4 shows that the housing 6" comprises a first chamber section 701" and a filter means section 707". The first chamber section 701" comprises a first chamber.

The power converter cabinet of FIG. 3 is a scalable cabinet. An end portion comprising the control component section 703" and the AC cabling section 704" is a common part of the cabinet while the rest of the cabinet forms a duplication part which may be duplicated, or multiplied. In embodiments where a power converter cabinet comprises a common part and a plurality of duplication parts, bus bars extend from one duplication part to another.

Figure 5:
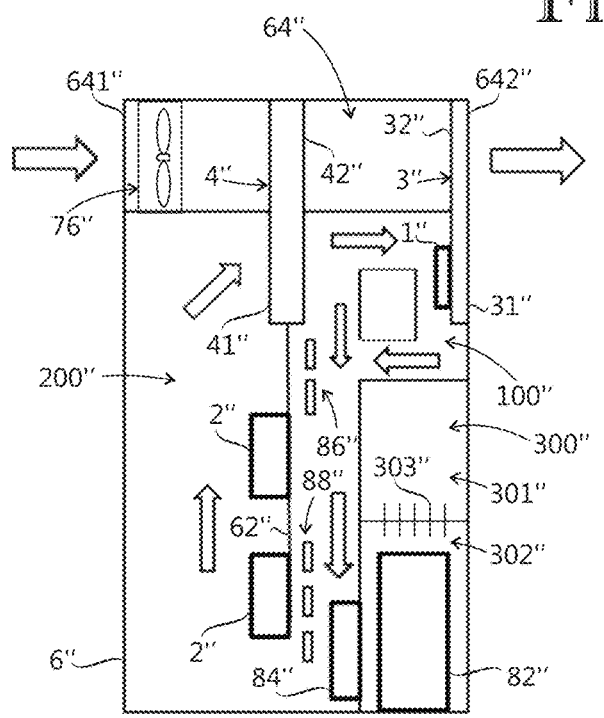
FIG. 5 shows a simplified internal structure of the power converter cabinet of FIG. 3.

FIG. 5 shows a simplified internal structure of the power converter cabinet of FIG. 3. The power converter cabinet comprises a housing 6", a first chamber 100", a second chamber 200", a third chamber 300", a first type device 1", two second type devices 2", filter means, bus bar means, cooling means for cooling the first chamber and the second chamber, a cooling channel 64" and cooling channel fan means 76". The first chamber 100" and the second chamber 200" are located inside the housing 6". The first type device 1" is located in the first chamber 100", and the second type devices 2" are located in the second chamber 200".

The second chamber 200" comprises a partition wall dividing the second chamber 200" into the second type device section 702" and the DC component section 705". FIG. 5 shows the second type device section of the second chamber 200". The partition wall is not depicted in FIG. 5. The partition wall extends in a plane parallel to the image plane of FIG. 5.

The cooling means comprises a first cooling element 3" and a second cooling element 4". The first cooling element 3" is adapted to transfer heat out of the first type device 1". The first cooling element 3" comprises a first portion 31" located in the first chamber 100" and a second portion 32" located in the cooling channel 64". The first portion 31" of the first cooling element 3" is in direct contact with the first type device 1".

The second cooling element 4" is adapted to transfer heat out of the second chamber 200". The second cooling element 4" comprises a first portion 41" located in the second chamber 200" and a second portion 42" located in the cooling channel 64". The first portion 41" is located between the first chamber 100" and the second chamber 200". The second cooling element 4" is in a heat transfer connection with the second type devices 2" exclusively through a gaseous cooling medium.

The cooling channel 64" extends through the housing 6". The cooling channel 64" has a first end 641" and a second end 642". The cooling channel fan means 76" is adapted for providing a cooling channel cooling medium flow between the first end 641" of the cooling channel and the second end 642" of the cooling channel.

The gaseous cooling medium inside the housing 6" is air. The cooling channel fan means 76" sucks air from the outside of the housing 6" to the first end 641" of the cooling channel, and blows air to the outside of the housing 6" from the second end 642" of the cooling channel. The first cooling element 3" is adapted to function as a base-to-air cooling element, and the second cooling element 4" is adapted to function as an air-to-air cooling element.

The bus bar means comprises DC bus bars 86" and AC bus bars 88". Both the DC bus bars 86" and the AC bus bars 88" are located in the first chamber 100", in an air circulation channel formed by the first chamber 100".

The second chamber 200" is partially separated from the first chamber 100" by a separating wall 62". Also the first portion 41" of the second cooling element 4" participates in separating the first chamber 100" from the second chamber 200". The cooling medium flows into the first chamber 100" from an upper portion of the second chamber 200", and into the second chamber 200" from a lower portion of the first chamber 100". The cooling medium flows into the first chamber 100" through the first portion 41" of the second cooling element 4" which cools down the cooling medium.

Each of the first chamber 100" and the second chamber 200" is separated from the cooling channel 64" and from the outside of the housing 6". The first chamber 100" and the second chamber 200" are ingress protected chambers. The cooling channel 64" is not an ingress protected channel.

The second portion 32" of the first cooling element 3" and the second portion 42" of the second cooling element 4" are located in the cooling channel 64". The second portion 42" of the second cooling element 4" is located upstream of the second portion 32" of the first cooling element 3".

The third chamber 300" is separated from the first chamber 100". The third chamber 300" comprises a first sub-chamber 301" and a second sub-chamber 302" separated from the first sub-chamber 301". The third chamber 300" comprises a third cooling element 303" adapted to transfer heat from the second sub-chamber 302" to the first sub-chamber 301". The third cooling element 303" is an air-to-air cooling element.

There is a forced cooling medium flow between the outside of the housing 6" and the first sub-chamber 301". Further, there is a separate forced cooling medium flow inside the second sub-chamber 302".

The filter means is adapted to improve the quality of power fed from the power conversion assembly by filtering switching frequencies of the power conversion assembly. The filter means comprises an LCL filter which is known in the art. A capacitor assembly 84" of the filter means is located in the first chamber 100", and is adapted to be cooled by a forced cooling medium flow circulating between the first chamber 100" and the second chamber 200". An inductor assembly 82" of the filter means is located in the second sub-chamber 302" of the third chamber 300".

The forced cooling medium flow circulating between the first chamber 100" and the second chamber 200" is also adapted to cool the second type devices 2" and the bus bar means. The forced cooling medium flow also participates, to some extent, in cooling the first type device 1". Means for providing the forced cooling medium flow is not depicted in FIG. 5.

It will be obvious to a person skilled in the art that the inventive concept can be implemented in various ways. The invention and its embodiments are not limited to the examples described above but may vary within the scope of the claims.

The invention claimed is:

1. A cooled power conversion assembly comprising:
a first chamber;
a second chamber at least partially separated from the first chamber;
a housing inside which the first chamber and the second chamber are located;
at least one first type device located in the first chamber;
at least one second type device located in the second chamber; and
cooling means comprising a first cooling element and a second cooling element, the first cooling element being adapted to transfer heat out of the first chamber and comprising a first portion located in the first chamber and a second portion located outside the first chamber, the second cooling element being adapted to transfer heat out of the second chamber and comprising a first portion located in the second chamber and a second portion located outside the second chamber,
wherein the first portion of the first cooling element is in direct heat conducting contact with the at least one first type device, and the second cooling element is in a heat transfer connection with the at least one second type device through a gaseous cooling medium and
wherein the cooled conversion assembly comprises a cooling channel extending through the housing and cooling channel fan means for providing a cooling channel cooling medium flow between a first end of the cooling channel and a second end of the cooling channel, the second portion of the first cooling element being located at a first location in the cooling channel, the second portion of the second cooling element being located at a second location in the cooling channel upstream of the first location, and wherein the cooled power conversion assembly is adapted to convert electric energy from one form to another, and a heat density of the at least one first type device is higher than a heat density of the at least one second type device, and
wherein the first cooling element is a heat pipe or a finned element comprising a cooling fin protruding into the cooling channel, and the second cooling element is a heat pipe or a finned element comprising a cooling fin protruding into the cooling channel, and
wherein the first cooling element is adapted to function as a base-to-air cooling element, and the second cooling element is adapted to function exclusively as an air-to-air cooling element.

2. A cooled power conversion assembly according to claim 1, wherein the first chamber and the second chamber are located adjacent to each other and are at least partially separated from each other by a separating wall.

3. A cooled power conversion assembly according to claim 1, wherein the cooled power conversion assembly comprises second chamber fan means for providing a second chamber cooling medium flow inside the second chamber, the second chamber cooling medium flow being adapted to enhance heat transfer from the at least one second type device to the first portion of the second cooling element.

4. A cooled power conversion assembly according to claim 1, wherein the at least one first type device comprises a diode module of a rectifier unit and/or a switch module of an inverter unit.

5. A cooled power conversion assembly according to claim 1, wherein the at least one second type device comprises protection means and/or connection means, the protection means being adapted for protecting the at least one first type device, and the connection means being adapted for connecting the at least one first type device to a supply and/or a load.

6. A cooled power conversion assembly according to claim 1, wherein the first chamber and the second chamber are ingress protected chambers.

7. A cooled power conversion assembly according to claim 1, wherein the first cooling element comprises a thermosiphon, and/or the second cooling element comprises a thermosiphon.

8. A cooled power conversion assembly according to claim 1, wherein the cooled power conversion assembly comprises filter means and a third chamber comprising a first sub-chamber, a second sub-chamber separated from the first sub-chamber, a third cooling element adapted to transfer heat from the second sub-chamber to the first sub-chamber, and means for providing a forced cooling medium flow between the outside of the housing and the first sub-chamber, wherein an inductor assembly of the filter means is located in the second sub-chamber, and the third cooling element is an air-to-air cooling, element.

9. A cooled power conversion assembly according to claim 8, wherein the cooled power conversion assembly comprises means for providing a forced cooling, medium flow circulating between the first chamber and the second chamber, wherein a capacitor assembly of the filter means is located in the first chamber, and is adapted to be cooled by the forced cooling medium flow circulating between the first chamber and the second chamber.

* * * * *